United States Patent [19]

Okishi

[11] 4,126,460
[45] Nov. 21, 1978

[54] LIGHT SENSITIVE PRINTING PLATE COMPRISING A MATTED OVERLAYER

[75] Inventor: Yoshio Okishi, Yoshida, Japan

[73] Assignee: Fuji Photo Film Co., Ltd., Minami-ashigara, Japan

[21] Appl. No.: 718,504

[22] Filed: Aug. 30, 1976

[30] Foreign Application Priority Data

Aug. 28, 1975 [JP] Japan ................................. 50-104285

[51] Int. Cl.² ............................ G03C 1/72; G03F 7/02
[52] U.S. Cl. ......................................... 96/35.1; 96/33; 96/36.3; 96/67; 96/79; 96/72; 96/73; 96/84 UV; 96/50 PL; 101/456; 101/457; 101/462
[58] Field of Search .................. 96/33, 36.3, 67, 72, 96/73, 74, 79, 84 R, 50 PL, 84 UV, 35.1; 101/457, 456, 462

[56] References Cited

U.S. PATENT DOCUMENTS

| | | | |
|---|---|---|---|
| 2,975,053 | 3/1961 | Schmidt et al. | 96/33 |
| 2,992,101 | 7/1961 | Jelley et al. | 96/74 X |
| 3,136,637 | 6/1964 | Larson | 96/75 |
| 3,190,197 | 6/1975 | Pinder | 96/84 UV |
| 3,615,468 | 10/1971 | Tiala | 96/79 X |
| 3,754,919 | 8/1973 | Sobel et al. | 96/84 UV |
| 3,793,217 | 2/1974 | Janssens et al. | 96/84 UV |
| 3,794,493 | 2/1974 | Sobel et al. | 96/84 UV |
| 3,856,529 | 12/1974 | Schadlich et al. | 96/81 |
| 3,891,443 | 6/1975 | Halpern et al. | 96/79 |
| 3,894,873 | 7/1975 | Kobayashi et al. | 96/33 |
| 3,897,251 | 7/1975 | Detrick | 96/36.2 |
| 4,013,465 | 3/1977 | Clapham et al. | 96/36 |

OTHER PUBLICATIONS

Uhlig, "The Journal of Photographic Science", v. 18, 1970, pp. 4-6.

*Primary Examiner*—Edward C. Kimlin
*Attorney, Agent, or Firm*—Sughrue, Rothwell, Mion, Zinn and Macpeak

[57] ABSTRACT

A light sensitive printing plate comprising a support having provided thereon a light sensitive layer and a matted layer, said matted layer being removable upon development and containing a light absorbing agent possessing an absorption in the spectral region to which the light-sensitive material coated on the light sensitive printing plate is sensitive.

20 Claims, 6 Drawing Figures

LIGHT SENSITIVE PRINTING PLATE COMPRISING A MATTED OVERLAYER

BACKGROUND OF THE INVENTION

1. Field of the Invention

The present invention is directed to a light sensitive printing plate.

2. Description of the Prior Art

In the case that a light sensitive printing plate is exposed to light through an original, it has been hithertofore necessary that an additional resin layer be further provided on the surface of a light sensitive layer of the light sensitive printing plate, and the surface of the resin layer be intimately contacted with the original. For this purpose, there was employed a method which comprised placing a light sensitive printing plate and an original in laminated form between a rubber sheet and a glass sheet and pulling a vacuum between the rubber sheet and the glass to bring the system into intimate contact (hereafter simply referred to as a vacuum contact method). In conventional light sensitive printing plates, the surface thereof was smooth and close contact started at peripheral portions in the case that an original was intimately contacted therewith by means of a vacuum contact method. As a result, intimate contact at central portions was prevented. Therefore, in order to completely intimately contact an original over the whole surface of the light sensitive printing plate, an extremely long period of time was required. If imagewise exposure was conducted in a state of incomplete contact, a clear image could not be obtained at areas where close contact was incomplete so that a clear print was not obtained. In addition, if a long period of time was required for the intimate contact, the efficiency of printing was lowered. Accordingly, it has long been desired to shorten the contact time.

The inventors previously proposed providing on the surface of a light sensitive printing plate a matted layer capable of being removed upon development (Japanese Patent Application Nos. 31153/74 and 84902/74). When these light sensitive printing plates were employed under standard conditions, the vacuum contact time was remarkably shortened to one-half to one-third. However, it has been found that when these light sensitive printing plates were exposed to light in a large amount of 5 to 20 times the standard exposure amount, and subsequently developed under standard conditions, unclear portions were caused in dot image areas of the light sensitive printing plate.

SUMMARY OF THE INVENTION

Accordingly, the object of the present invention is to provide a light sensitive printing plate having on the surface thereof an improved matted layer in which no unclear dot image areas are caused.

DETAILED DESCRIPTION OF THE INVENTION

After continuous study for achieving the aforementioned object, the inventors found that in a light-sensitive printing plate having on the surface thereof a matted layer capable of removal upon development which comprises a light absorbing agent which absorbs radiation in the spectral region to which a light sensitive material coated on the light sensitive printing plate is sensitive provides a clear dot image on the light sensitive printing plate even when an exposure amount is 5 to 20 times the standard exposure amount is given and a standard development is subsequently performed. Since the printing plate of the present invention can be utilized as many different types of printing plates, for example, a lithographic printing plate, a relief printing plate, a deep etch printing plate, an intaglio printing plate, etc., the "standard developments" therefor cannot be unequivocally defined, but can be freely selected from "standard developments" as are conventionally used in the art. Roughly, development is typically with a desired developer (for example, an acid, alkali or organic solvent developer) for a time on the order of about 1 to 5 minutes at a temperature on the order of about 15 to about 30° C. Seldom will development be performed at other than at atmospheric pressure.

As one skilled in the art will appreciate, the standard exposure amount will vary depending upon the light-sensitive material under consideration. In general, however, a negative type printing plate is exposed to light so that steps 4 to 6 on a standard gray scale are solid black, whereas a positive type printing plate is exposed to light so that step 4 of a standard gray scale is clear, wherein the gray scale has 15 steps ranging (in equal density increments) from a transmission density of from 0.05 (first step) to a transmission density of 2.15 (15th step).

Figure 1A:
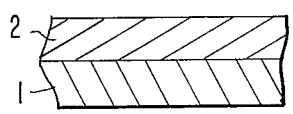
FIGS. 1 through 4 are cross sectional views which show embodiments of light sensitive printing plates in accordance with the present invention, respectively.
Figure 1B:
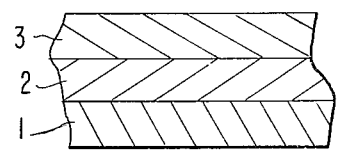

In the present invention, a light sensitive printing plate basically comprises a support 1 having provided thereon a light sensitive layer 2 (FIG. 1a), and may further comprise an additional resin layer 3 on the light sensitive layer 2 (FIG. 1b).

The light sensitive printing plate used in the present invention is utilized in the preparation of a printing plate for lithographic printing, relief printing, deep etch printing, intaglio printing, etc.

The aforementioned support includes materials which are dimensionally stable and as are used as a support for conventional printing plates. Such materials are preferably used in the present invention. Preferred examples of such supports are paper, paper having laminated thereon a polymer (for example, polyethylene, polypropylene, polystyrene, etc.), a metal plate such as zinc, iron, copper, etc., a film of a polymer such as cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate, polyvinyl acetal, etc., paper or a polymer film having laminated or deposited thereon a metal as described above, etc. Suitable materials are chosen from these support materials depending upon the type of printing plate. For example, in the case of a light sensitive lithographic printing plate, it is preferred to choose an aluminum plate, a laminate comprising an aluminum sheet on a polyethylene terephthalate film, etc. In the case of a light sensitive relief printing plate, a polyethylene terephthalate film, an aluminum plate, an iron plate and the like are preferred.

If desired or necessary, the support may be subjected to a surface treatment. For example, in case of a light sensitive lithographic printing plate, the surface of the support is often subjected to a treatment to render the same hydrophilic. Such a treatment to render the support hydrophilic can be exemplified by various methods, for example, in the case that a support possesses a surface of a polymer, there are surface treatment methods such as a chemical treatment, a discharge treatment, a flame treatment, a treatment with ultraviolet rays, a treatment with high frequency waves, a glow discharge treatment, an active plasma treatment, a laser treatment (which are described in, for example, U.S. Pat. Nos. 2,764,520, 3,497,407, 3,145,242, 3,376,208, 3,072,483, 3,475,193 and 3,360,448, British Pat. No. 788,365, etc.), and a method comprising coating a subbing layer on the plastic layer after once subjecting the same to a surface treatment.

Many coating methods are known which can be used to practice this invention. One is a dual layer method which comprises coating as a first layer a hydrophobic resin layer which adheres well to a polymer and has a good solubility, and coating as a second layer a hydrophilic resin layer; the other is a single layer method which comprises coating a resin layer containing a hydrophobic group and a hydrophilic group in the same polymer.

In the case of a support having a surface of metal, especially aluminum, it is preferred that a surface treatment such as a graining immersion in an aqueous solution of sodium silicate, potassium zirconate fluoride, phosphates, etc., be performed. In addition, an aluminum plate which has been subjected to graining and then immersed in an aqueous solution of sodium silicate as is described in U.S. Pat. No. 2,714,066, or an aluminum plate which has been subjected to anodic oxidation and then immersed in an aqueous solution of an alkali metal silicate as is described in U.S. Pat. No. 3,181,461 can also suitably be used. The aforementioned anodic oxidation treatment is performed by applying an electric current in an electrolyte of an aqueous solution or a non-aqueous solution of an inorganic acid such as phosphoric acid, chromic acid, sulfuric acid, boric acid, etc., or an organic acid such as oxalic acid, sulfamic acid, etc., or salts thereof, singly or in combination, using an aluminum plate as an anode.

An electrodeposition as is described in U.S. Pat. No. 3,658,662 is also effective.

These treatments for obtaining a hydrophilic surface are performed, of course, so that the surface of the support is rendered hydrophilic, and, in addition, for the purpose of preventing harmful reaction with a light sensitive composition provided on the support and improving intimate contact with a light sensitive layer.

Any light sensitive material which is provided on a support can be used so long as its solubility or swellability in a developer changes before and after exposure to light, and, if desired, the light-sensitive material can be freely selected from those conventionally used in the art which meet these criteria. Particularly preferred examples are diazo compounds, for example, a light sensitive composition comprising a diazo resin and shellac (see Japanese Patent Application OPI 24404/72), a homopolymer or copolymer of hydroxyethyl methacrylate and a diazo resin (typically used comonomers include addition polymerizable unsaturated compounds such as acrylates, acrylamides, methacrylates, methacrylamides, allyl compounds, vinyl ethers, vinyl esters, styrenes, crotonates, and the like, and, of these, methylmethacrylate and acrylonitrile are particularly preferred), a diazo resin and a soluble polyamide (see U.S. Pat. No. 3,751,257), an azide light sensitive material and an epoxy resin (see U.S. Pat. No. 2,852,379), an azide light sensitive material such as a poly (vinyl p-azidobenzoate), a poly(vinyl azidophthalate), a polyazidostyrene, a polyvinyl azidobenzalacetal, a polyvinyl azidonaphthylacetal, an azidobenzaldhyde phenol, and the like, a diazo resin (a condensation product of p-diazodiphenylamine and paraformaldehyde is widely used as the diazo resin; in addition to such a condensation product, 1-diazo-4-dimethylaminobenzene.hydrofluoroborate, 1-diazo-3-methyl-4-dimethylaniline-sulfate, 1-diazo-3-monoethylnaphthylamine, etc., can also be used), etc.; a light sensitive resin which possesses unsaturated double bonds in the molecule thereof as is represented by polyvinyl cinnamate, and undergoes dimerization by irradiation with active rays to become insoluble, for example, polyvinyl cinnamate derivatives as are described in British Pat. Nos. 843,545 and 966,297, and U.S. Pat. No. 2,725,372; a light sensitive polyester obtained by the condensation of bis-phenol A and divanilalcyclohexanone or p-phenylenediethoxyacrylate and 1,4-di-$\beta$-hydroxyethoxycyclohexanone as are described in Canadian Pat. No. 696,997; a prepolymer of diallyl phthalate as is described in U.S. Pat. No. 3,462,267; an ethylenically unsaturated compound which possesses at least two unsaturated double bonds and undergoes polymerization upon irradiation with active rays, for example, an unsaturated ester of a polyol as described in Japanese Patent Publication 8495/60, e.g., ethylene di(meth)acrylate, diethylene glycol di(meth)acrylate, glycerol di(meth)acrylate, glycerol tri(meth)acrylate, ethylene dimethacrylate, 1,3-propylene di(meth)acrylate, 1,4-cyclohexanediol (meth)acrylate, 1,4-benzenediol di(meth)acrylate, pentaerythritol tetra(meth)acrylate, 1,3-propylene glycol di(meth)acrylate, 1,5-pentanediol di(meth)acrylate, pentaerythritol tri(meth)acrylate, a bisacrylate or bismethacrylate of a polyethylene glycol having a molecular weight of about 50 to about 500; an unsaturated amide, especially amides of $\alpha$-methylene carboxylic acids and $\omega$-diamine derivatives which are mediated by $\alpha,\omega$-diamine and oxygen, e.g., methylene bis(meth)acrylate and diethylene triamine tris(meth)acrylamide; a negative working type light sensitive composition which is rendered insoluble by exposure to active rays, for example, a light sensitive composition comprising divinyl succinate, divinyl adipate, divinyl phthalate, divinyl terephthalate, divinylbenzene-1,3-disulfonate or the like, plus a suitable binder (preferred binders have a molecular weight of from about 500 to about 50,000). The ratio of the binder to the other components is not overly important so long as, of course, the binder can exhibit its "binding" or supporting function; in general, excellent results are obtained using about 0.1 to about 10 parts by weight of binder based on 1 part by weight of the light-sensitive material, for example, polyvinyl alcohol or a cellulose derivative which contains carboxyl groups in the side chain thereof, e.g., polyvinyl hydrogen phthalate, carboxymethyl cellulose, or a copolymer of methyl methacrylate and methacrylic acid; a light sensitive composition comprising materials as are described in U.S. Pat. Nos. 3,635,709, 3,061,430 and 3,061,120, o-diazoxide type light sensitive materials such as a 2,3,4-trioxybenzophenon-3,4-bis[naphthoquinone-1,2-diazido-5-sulfonic acid] ester, a 2-[naphthoquinone-1,2-diazido-5-sulfonyloxy]-7-oxynaphthalene, a naphthoquinone-1,2-diazido-5-sulfanilide, a naphthoquinone-1,2-diazido-5-sulfonic acid novolak ester, etc., phosphorus tungstates of diazo resins (see Japanese Patent Publication 7663/64), ferrocyanides of diazo resins (see U.S. Pat. No. 3,113,023) and diazo resins and polyvinyl hydrogen phthalate (see Japanese Patent Application No. 18812/65) or the like is suitable as a positive working type light sensitive material. Further, a light sensitive composition containing a linear polyamide and a monomer having addition-polymerizable unsaturated bonds as are described in U.S. Pat. Nos. 3,081,168, 3,486,903, 3,512,971, 3,615,629, etc., are also useful.

The light sensitive printing plate used in the present invention, on the surface of which a matted layer is provided, possesses a basic structure which comprises a support having provided thereon a light sensitive layer comprising the light sensitive material as described above. However, the light sensitive printing plate may further contain a resin layer on the light sensitive layer. The resin layer identity is not overly important, and typically a resin such as a nylon, a phenol resin or the like will be used; typically such will be coated in an amount of about 0.1 to about 2.0 g/m$^2$ (dry basis).

The matted layer on the surface of the light sensitive printing plate may be any one so long as it has no adverse influence on the light sensitive materials which constitute the light sensitive layer(s) physically and chemically, is easily removable upon development and does not undergo any deleterious interaction with the developer used. As will be later made clear, a matting agent per se is not mandatory in all embodiments of the present invention, i.e., the matted layer can be formed in some other manner.

When a matting agent is used, such can be selected from those conventionally used by the art. When a matting agent is incorporated in the matted layer, preferred examples thereof include particles of $SiO_2$, $ZnO$, $TiO_2$, $ZrO_2$, glass, alumina, starch, polymers (for example, polymethacrylates, polystyrenes, phenol resins, etc.), and matting agents as are disclosed in U.S. Pat. Nos. 2,701,245 and 2,992,101. These matting agents may be utilized alone or as various combinations thereof.

The binder utilized with the matted layer may be freely selected from those as are conventionally used in the art to form matted layers, and such include, for example, gum arabic, cellulosic materials (for example, methyl cellulose, carboxymethyl cellulose, hydroxyethyl cellulose, hydroxypropyl methylcellulose, and the like), polystyrene potassium sulfonate, starches (for example, soluble starch, an enzyme modified strach, etc.), polyvinyl pyrrolidone, polyvinyl alcohol, polyvinyl butyral, polyacrylic acid, polysaccharides (for example, α-sorbitol), which may be used alone or as various combinations thereof. The above listing of binders is not to be construed as limitative, merely illustrative, and any binder can be utilized which can be eliminated upon development.

It should be noted, in this regard, that most preferably the light-sensitive layer is coated in an amount of from about 0.05 to about 7.0 g/m$^2$ (dry basis), and the matted layer is coated in an amount of from about 0.01 to about 5.0 g/m$^2$, even more preferably 0.08 to 2.5 g/m$^2$ (dry basis). These coating thicknesses are not to be construed as limitative (these coating amounts correspond to thicknesses as follows: 1 g/m$^2$=1μ). However, the surface roughness of the matted layer is limited. It is suitable that the particle diameter of a matting agent be in a range of from about 2 to about 40 microns, particularly preferably in a range of 6 to 20 microns. In the case of using a matting agent, it is preferred that the amount thereof be about 0.05 to about 4 parts by weight to 1 part by weight of resin (binder) in the coating liquid used, more preferably, 0.3 to 2 parts by weight, same basis. When such a matting agent is incorporated in a matted layer, it is generally the case that the matting agent is dispersed in a solution of a resin used as a binder in a suitable solvent, e.g., water, carbon tetrachloride, ethyl acetate, benzene, etc., and the dispersion is coated on the surface of a light sensitive printing plate. Coating is accomplished with ease when the matting agent: resin: solvent ratio is on the order of 0.05 to 4:1:5 to 20 (wt. ratio), even more preferably 0.3 to 2:1:8 to 15.

Figure 5:
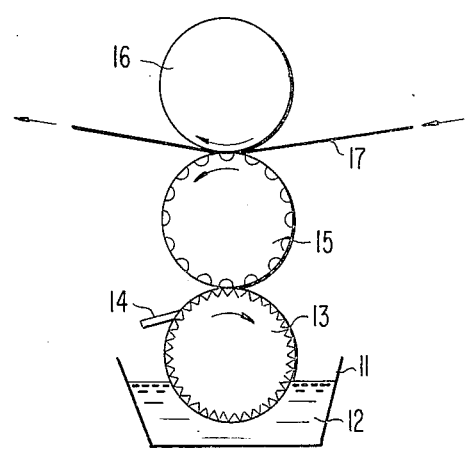
FIG. 5 shows an outline of a coating apparatus which can be used for providing a matted layer in accordance with the present invention.

It is to be noted that whether or not a matting agent is employed, the same apparatus can be used for forming a matted layer involved, for example, the apparatus as illustrated in FIG. 5 or, in addition, matting techniques as disclosed in U.S. Patent application Ser. Nos. 598,951 filed July 24, 1975, now abandoned; 659,477 filed Fed. 19, 1976, now abandoned; and 560,011 filed Mar. 19, 1975 now abandoned, can be used to form matted layers without the presence of a matting agent.

Figure 2:
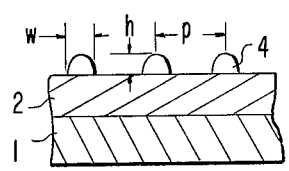
Figure 3:
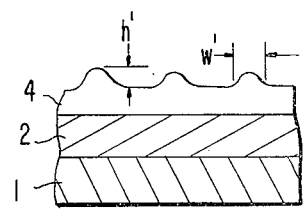
Figure 4:
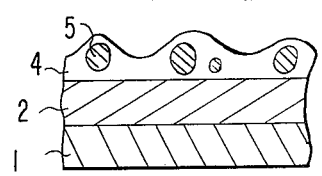

As the above discussion should make clear, a matting agent is not necessarily incorporated in the matted layer in the embodiments of FIG. 2 and FIG. 3, but is necessary in the matted layer of the embodiment of FIG. 4. Of these matted layers, the matted layer illustrated in FIG. 2 is superior in effects as a matted layer, in the results obtained upon development, in external appearance and with respect to the amount of coating material required.

Specific examples of light absorbing agents include, for example, dyes, pigments, food dyes, diazo compounds, ethylenically unsaturated compounds, ultraviolet ray absorbing agents, etc. However, one should select light absorbing agents which possess absorption at the active ray area(s) of the light sensitive material of the light sensitive printing plate, as the light absorbing agent is incorporated in a matted layer.

From such a viewpoint, it is preferred to use a light absorbing agent possessing an absorption at a wavelength of about 200 mμ to about 800 mμ, more preferably 250 mμ to 600 mμ.

Specific examples of light absorbing agents which are used are dyes such as tartrazine (C.I. Acid Yellow 23), Direct Fast Yellow R (made by Sumitomo Chemical Co., Ltd., C.I. Direct Yellow 50), Sumiacryl Yellow G (tradename, made by Sumitomo Chemical Co., Ltd.,) Sunchromine Fast Yellow 5G (tradename, made by Sumitomo Chemical Co., Ltd., C.I. Mordant Yellow 23), Sumiacryl Brilliant Red BB (tradename, made by Sumitomo Chemical Co., Ltd., C.I. Basic Red 15), Diato Orange Salt GGD (tradename, made by Daito Chemical Co., Ltd., C.I. Azoic Diazo Component 16), Nissen Yellow G (tradename, made by Sumitomo Chemical Co., Ltd., C.I. Sulphur Yellow 4), Nihonthrene Golden Yellow GKP pst (tradename, made by Sumitomo Chemical Co., Ltd., C.I. Vat Yellow 4), Miketon Discharge Yellow 3G (tradename, made by Mitsui Toatsu Chemical Co., Ltd., C.I. Disperse Yellow 4), Whitex BN conc (tradename, made by Sumitomo Chemical Co., Ltd., C.I. Fluorescent Brightening Agent 86), Oil Yellow SS special (tradename, made by Hakudo Chemical Research Institute, C.I. Solvent Yellow 56), Procion Yellow H-A (tradename, made by I.C.I., C.I. Reactive Yellow 3), Whitex (tradename, made by Sumitomo Chemical Co., Ltd.), etc.; pigments such as titanium yellow, Oralith Yellow 2G (tradename, made by CIBA, C.I. Pigment Yellow 6), etc.; food dyes such as Food Yellow No. 5 (C.I. Food Yellow 3), etc.; diazo compounds such as p-diazophenylamine chlorides or complex salts of p-diazodiphenylamine chlorides and zinc chloride, etc.; ethylenically unsaturated compounds such as ethylene di(meth)acrylate, etc.; ultraviolet ray absorbants such as hydroxy benzophenone, benzotriazole or the like.

In the case that these light absorbing agents are employed, though such depends upon the light absorption strength of the light absorbing agent, generally it is preferred that the light absorbing agent be used in an amount of 0.00001 to about 0.1 part by weight per 1 part by weight of resin(s) in a coating liquid, more preferably 0.0001 to 0.01 part, same basis. When such a light absorbing agent is incorporated in the matted layer, it is preferred that the light absorbing agent be dispersed or dissolved in a solution of a resin used as a binder in a suitable solvent, e.g., water, carbon tetrachloride, ethyl acetate, benzene, etc., and the resultant dispersion or solution be coated on the surface of a light sensitive printing plate. When a matting agent is present, good results are obtained when the matting agent:resin: solvent:light absorbing agent weight ratio is on the order of 0.05 to 4:1:5 to 20:0.00001 to 0.1, even more preferably 0.3 to 2:1:8 to 15:0.0001 to 0.01. When a matting agent is not present, the resin: solvent:light absorbing agent weight ratio is advisably 1:4 to 100:0.00001 to 0.1, even more preferably 1:5 to 50:0.0001 to 0.01.

The light absorbing agent can be used singly or in combination by selecting specific examples as are described above. The light absorbing agent is not limited to these specific examples, of course.

The light sensitive printing plate in accordance with the present invention can comprise, in one embodiment, a support having provided thereon, in order, a light sensitive layer, a resin layer which is oleophilic, hydrophobic, water soluble and softened by a solvent, e.g., isopropyl alcohol, n-propyl alcohol, ethyl acetate, benzene, etc., and a matted layer. When this light sensitive printing plate is exposed to light through an original, in the case of a negative light sensitive material the exposed areas of the light sensitive layer are rendered insoluble in a developer, and, at the same time, are associated with the resin layer on the light sensitive layer; however, the unexposed areas of the light sensitive layer remain unchanged and are soluble in the developer, therefore, when the exposed printing plate is subjected to development, the unexposed areas of the light sensitive layer are dissolved out in the developer which permeates into the resin layer peovided on the light sensitive layer, and, accordingly, if the surface is softly rubbed with cotton or the like impregnated with the developer, the unexposed areas of the resin layer are also removed but the exposed areas of the light sensitive layer and the resin layer provided thereon remain on the support without being affected by the developer; thus, a printing plate having a tough image is obtained.

Further, in the case of a positive light sensitive material, the exposed areas of the light sensitive layer are rendered soluble in a developer, and, on the other hand, the unexposed areas of the light sensitive layer remain unchanged and are insoluble in the developer; when the exposed printing plate is subjected to development, the exposed areas of the light sensitive layer are dissolved out in the developer which permeates into the resin layer provided thereon, and, therefore, the exposed areas of the resin layer can also be removed by softly rubbing the surface thereof with cotton or the like impregnated with the developer. However, the unexposed areas of the light sensitive layer and the resin layer provided thereon remain on the support without being affected by the developer to provide a printing plate having a tough image. In the above described embodiments, the matted layer is provided on the resin layer (FIG. 4).

In the present invention, the matted layer 4 which constitutes the uppermost layer of such a light sensitive printing plate and is removable upon development refers to:

(1) a layer having micropatterns in which coated areas removable upon development and non-coated areas are present as a mixture (FIG. 2);

(2) a layer which is removable upon development and coated with a roller having uneveness (FIG. 3); and (3) a layer which contains a matting agent therein and is removable upon development (FIG. 4).

The matted layer on the surface of the light sensitive printing plates as are shown in FIG. 2 and FIG. 3 is provided so as to possess the following surface roughness; that is, it is preferred that the height of the coated portion be in the range of about 2 to about $40\mu$, particularly 5 to $20\mu$; the size (width) be in the range of about 20 to about $10,000\mu$, particularly 50 to $5,000\mu$; it is also preferred that the distance between coated portions adjacent to each other be in a range of about 50 to about $100,000\mu$, particularly preferably 100 to $50,000\mu$; and that the surface roughness be in the range of about 0.05 to about $20\mu$ as $H_{CLA}$ (central line surface roughness (JIS)), more preferably, about 0.1 to about $10\mu$ as $H_{CLA}$. Explaining the terminology utilized above in some greater detail, the "height" of the coated portion in FIG. 2 is represented as $h$, and in FIG. 3 is represented as $h'$, whereas the "size" (width) is represented in FIG. 2 as $w$ and in FIG. 3 as $w'$. In FIG. 4, due to the sinusoidal nature of the element, a similar approach is utilized but exact dimensions are generally given as approximations due to the nature of the element. The "distance" is, of course, the pitch (exemplified as $p$ in FIG. 2).

If the surface roughness as $H_{CLA}$ becomes smaller than about $0.05\mu$ mentioned above, the effect of shortening the time required for intimate contact by means of a vacuum contact method is lessened; on the other hand, if the surface roughness becomes greater than about $20\mu$, intimate contact of a light sensitive printing plate with an original becomes incomplete so that image sharpness is decreased.

In the matted layer of the light sensitive printing plate as is shown in FIG. 4, it is preferred that the surface roughness expressed as $H_{CLA}$ (central line surface roughness (JIS)), be in a range of about 0.4 to about $5\mu$, more preferably, in the range of 0.8 to $1.5\mu$.

If the surface roughness is smaller than about $0.4\mu$ (as $H_{CLA}$) as mentioned above, the effect of shortening the time required for intimate contact by means of a vacuum contact method is lessened; on the other hand, if the surface roughness exceeds about $5\mu$ (as $H_{CLA}$), intimate contact of a light sensitive printing plate with an original becomes incomplete so that images sharpness is decreased.

Surface active agents, etc., may also be incorporated in the matted layer which is removable upon development as are shown in FIGS. 2, 3 and 4.

A coating apparatus to provide the best matted layer on a light sensitive printing plate is as shown in FIG. 5.

The system to provide a matted layer as shown in FIGS. 2, 3 or 4 comprises coating a coating liquid 12 in a reservior 11 on a gravure roll 13 by means of a doctor blade 14 and providing the matted layer on a light sensitive printing plate 17 via coating roll and back-up roll 16.

By the incorporation of a light absorbing agent in the matted layer as thus shown in FIGS. 2, 3 or 4, it is possible to obtain clear dot images even when an exposure amount 5 to 20 times the standard exposure amount is applied. In addition, even when exposure is conducted in a standard exposure amount, an adverse influence is not seen due to the incorporation of a light absorbing agent.

In order to further illustrate the present invention, the present invention will be explained in more detail with reference to examples hereinbelow, where all percents are percent by weight, unless otherwise indicated.

Unless otherwise indicated, in all of the following examples the apparatus shown in FIG. 5 was utilized. The matted layer of FIGS. 2 and 3 were provided using the apparatus of FIG. 5 while varying the coating amount, whereas the matted layer of FIG. 4 was provided using the apparatus of FIG. 5 except for modifying the same by using a roller having a smooth surface instead of roller 15 shown in FIG. 5.

EXAMPLE 1

This example provides a comparison between a plate with a matted layer and a plate without a matted layer; it further provided a second comparison between a plate provided with a matted layer containing a light absorbing agent and a plate with a matted layer free of a light absorbing agent (specifically, the light absorbing agent is tartrazine), where both matted layers are free of a matting agent.

An aluminum plate having a thickness of 0.3 mm, was immersed in a 10% aqueous solution of sodium triphosphate at 80° C. for 3 mins. The plate was then washed with water and immersed in 10% nitric acid to subject it to a de-smutting treatment. After washing with water, the plate was immersed in a 2% aqueous solution of potassium zirconate fluoride at 80° C. for 3 minutes. Thereafter, the plate was washed with water and dried.

A solution (having the composition shown below) was coated onto the thus obtained aluminum plate and dried to provide a light sensitive layer on the aluminum plate. The coated amount was 500 mg/m² (dry basis).

| | |
|---|---|
| Polyhydroxyphenyl 2-diazo-1-naphthol-5-sulfonate (described in Example 1 of U.S. Pat. 3,635,709) | 5 g |
| Cyclohexane | 80 g |

A solution (having the composition shown below) was coated on this light sensitive layer in an amount of 0.16 g/m² (dry basis), in a manner as shown in FIG. 2, which was followed by drying.

| | | |
|---|---|---|
| Water | 100 | g |
| AG Gum (HE No. 1, made by Daiichi Industry Co., Ltd.) (water soluble cellulose ether type) | 2 | g |
| Tartrazine (λ= 430 mμ in water) | 0.008 | g |

Coating was performed using a roller having uneveness as is shown in FIG. 5.

The height of the coated portions was about 5μ; the diameter of the coated portions was about 20μ; and the distance between the coated portions was about 100μ. The $H_{CLA}$ of the coated portion was 0.8μ.

When the light sensitive lithographic printing plate thus provided was used, the period of time required for intimate contact with an original by means of a vacuum contact method was about 15 to about 20 secs. In the case that no matted layer was provided, 60 secs. or more were required.

From the results above, it was found that using the light sensitive lithographic printing plate in accordance with the present invention, the period of time required for intimate contact with an original was remarkably shortened.

After each of the light sensitive lithographic printing plates was exposed to light for 10 mins. at a distance of 70 cm using a 35 ampere carbon arc lamp, the printing plate was immersed in a 5% aqueous solution of sodium triphosphate at 25° C. for 1 min. The surface of the plate was then softly rubbed with cotton to develop the same. The water soluble cellulose ether layer was cleanly dissolved out over the whole surface of the plate and the exposed areas of the light sensitive layer were further removed to provide a positive image as in the original. No influence of micropatterns was observed in the light sensitive printing plate in which tartrazine was incorporated. No substantial difference in practical sensitivity (to a step wedge) was observed therebetween.

An identical light sensitive printing plate in which no tartrazine was incorporated was affected by micropatterns so that the dot image areas were unclear on the printing plate.

EXAMPLE 2

A solution having the composition shown below was coated as a coating layer as in Example 1 in a coated amount of 0.15 g/m² (dry basis) to yield a layer as is shown in FIG. 2. The coated layer was then dried.

| | | |
|---|---|---|
| Water | 100 | g |
| Polystyrene potassium p-toluenesulfonate (2% aqueous solution, viscosity 30 centipoise) | 5 | g |
| Syloid-162 (silicon dioxide, average particle size, 10 μ; made by Fuji Davison Co., Ltd.) | 2 | g |
| Titanium Yellow (λ= 410 mμ in water) | 0.005 | g |

The height of the coated portions was about 20μ; the diameter of the coated portions was about 1000μ; and the distance between the coated portions was kept to about 10,000μ. The $H_{CLA}$ of the coated portion was 1.8μ. The coated layer was provided so that the shape of the coated portions was cylindrical when viewed from above.

When the light sensitive lithographic printing plate was employed, the period of time required for intimate contact with an original was 20 to 30 seconds.

A printing plate was prepared using the light sensitive lithographic printing plate in a manner similar to Example 1. The printing properties of the printing plate thus obtained were then examined. Results similar to Example 1 were obtained.

EXAMPLE 3

A solution having the composition shown below was coated on the uppermost layer of a light sensitive printing plate obtained in a manner similar to Example 1 in a coated amount of 0.8 g/m² (dry basis) in a manner shown in FIG. 3. The coated layer was then dried. Coating was performed using a roller having unevenness as shown in FIG. 5 in a manner similar to Example 1.

| | | |
|---|---|---|
| Water | 100 | g |
| Hydroxypropylmethyl cellulose (degree of hydroxypropoxylation, 7-12 mol%; degree of methoxylation, 28-30 mol%; molecular weight about 20,000 to 30,000) | 5 | g |
| Syloid-266 (silicon dioxide, average particle size, 2 μ; made by Fuji Davison Co., Ltd.) | 2 | g |
| Tartrazine ($\lambda = 430$ mμ in water) | 0.01 | g |

The distance between convex portions and concave portions was about 500μ; the depth of the unevenness was about 5μ; and the radius of any convex portion was about 50μ. The $H_{CLA}$ of the coated portion was 0.5μ. When this light sensitive printing plate was employed, the period of time required for intimate contact with an original was 20 to 25 seconds. A printing plate was prepared using this light sensitive printing plate in a manner similar to Example 1. The printing properties were examined. As a result, results similar to Example 1 were obtained.

EXAMPLE 4

A light sensitive printing plate was prepared in a manner similar to Example 3 except that the $H_{CLA}$ of the coated portion was 0.8μ. A resin layer was coated thereon in a manner as shown in FIG. 4, and then dried. The coated amount was 1.0 g/m², dry basis. The period of time required for intimate contact with an original was 20 to 25 seconds.

The composition of the resin layer coated was as follows:

| | | |
|---|---|---|
| Water | 100 | g |
| Hydroxypropylmethyl cellulose (degree of hydroxypropoxylation, 7-12 mol%; degree of methoxylation, 28-30 mol%; molecular weight about 20,000 to 30,000) | 5 | g |
| Syloid-162 (silicon dioxide, average particle size, 10 μ; made by Fuji Davison Co., Ltd.) | 2 | g |
| Sumiacryl Yellow G(tradename, made by Sumitomo Chemical Co., Ltd.) ($\lambda = 410$ mμ) | 0.01 | g |

A printing plate was prepared using this light sensitive lithographic printing plate in a manner similar to Example 1. Printing properties were examined. Results similar to Example 1 were obtained.

EXAMPLE 5

An aluminum plate having a thickness of 0.3 mm was immersed in a 10% aqueous solution of sodium triphosphate kept at 80° C. for 1 minute to degrease the same. After washing with water, the degreased plate was rubbed with a nylon brush while sweeping a stream of a suspension of pumice powder in water thereacross to subject the same to a graining treatment. Subsequently, after washing with water, the plate was immersed for 3 mins. in a 5% aqueous solution of JIS No. 3 sodium silicate ($SiO_2/Na_2O = 3.1-3.3$ in a molar ratio) which was kept at 75° C. After washing with water and drying, a solution having the composition indicated below was coated in a coated amount of 1 g/m² (dry basis) thereon. The coated layer was then dried to provide a light sensitive layer.

| | | |
|---|---|---|
| Shellac | 10 | g |
| Polyvinyl acetate (molecular weight: 40,000 to 60,000) | 1 | g |
| Condensate of hexafluorophosphate of 4-diazo-4′-methoxyphenylamine and formaldehyde (as disclosed in U.S. Pat. 2,714,066) | 3 | g |
| Methylene blue | 0.3 | g |
| Methanol | 200 | g |
| Furfuryl alcohol | 50 | g |

Onto the light sensitive layer, there was coated a solution having the composition indicated below in a coated amount of 0.05 g/m² (dry basis) in a manner as shown in FIG. 2. The coated layer was subsequently dried.

Coating was performed using an apparatus as shown in FIG. 5.

| | | |
|---|---|---|
| Water | 100 | g |
| Enzyme-modified starch | 5 | g |
| Sumiacryl Yellow G(tradename, made by Sumitomo Chemical Co., Ltd.) ($\lambda = 410$ mμ) | 0.01 | g |

In this case, the coated portions had about a 3μ height, about a 70μ diameter and about a 500μ distance between the coated portions. The $H_{CLA}$ of the coated portion was 0.4μ.

When this light sensitive lithographic printing plate was employed, the period of time required for intimate contact with an original was 30 to 40 seconds. On the other hand, a time period of 60 seconds or longer was required for intimate contact in case that such a coated layer was not provided.

The aforementioned light sensitive lithographic printing plate intimately contacted with an original was exposed to light for 15 mins. at a distance of 70 cm. using a 30 ampere carbon arc lamp. The thus exposed printing plate was immersed in a developer at 25° C. having the composition indicated below for 10 seconds. Thereafter, the printing plate was rubbed with a soft cloth to develop the same.

| | |
|---|---|
| Methanol | 10 g |
| Water | 80 g |
| Sodium hydroxide | 1 g |

The matted layer was dissolved out, and the unexposed areas of the light sensitive layer were further cleanly removed to give a printing plate. The printing plate was not affected by the matted layer. There was no substantial difference in properties between the printing plate and a printing plate obtained using a light sensitive printing plated having no matted layer.

EXAMPLE 6

Onto the surface treated aluminum plate employed in Example 5 there was coated a solution having the composition shown below in an amount of 0.12 g/m² (dry basis). The coated layer was dried to provide a light sensitive layer.

| p-Toluenesulfonate salt of condensate of p-diazodiphenyl amine and formaldehyde (as disclosed in U.S. Pat. 3,136,637 at Column 7) | 1 g |
|---|---|
| Ethylene dichloride | 100 g |
| Methanol | 100 g |

Onto the light sensitive layer was coated a solution having the following composition.

| Polyvinyl formal (molecular weight: about 10,000 to 20,000) | 4 g |
|---|---|
| Phthalocyanine blue | 1 g |
| Ethylene dichloride | 500 g |
| Monochlorobenzene | 20 g |

The total weight in combination with the light sensitive layer was 0.31 g/m² after drying. A solution having the composition indicated below was further coated thereon. The coated layer was then dried.

| Water | 100 g |
|---|---|
| Hydroxypropylmethyl cellulose (degree of hydroxypropoxylation, 7-12 mol%; degree of methoxylation, 28-30 mol%; molecular weight of about 20,000 to about 30,000) | 5 g |
| Syloid-161 (silicon dioxide, average particle size, 7 μ; made by Fuji Davison Co., Ltd.) | 2 g |
| Complex of p-diazodiphenyl amine chloride and zinc chloride (λ= 400 mμ) | 2 g |

The coated amount was 1.0 g/m² (dry basis) and the matted layer was of the type as shown in FIG. 3.

The distance between convex portions and concave portions was about 800μ; the depth of the unevenness was about 10μ; and the radius of the convex portions was about 50μ. The $H_{CLA}$ of the coated portion was 0.6μ. When this light sensitive printing plate was employed, the period of time required for intimate contact with an original was 15 to 20 seconds. On the other hand, a light sensitive printing plate which had no matted layer required 60 to 70 seconds in order to intimately contact the printing plate with an original.

The light sensitive printing plate having intimately contacted an original therewith was exposed to light for 10 mins. at a distance of 70 cm using a 35 ampere carbon arc lamp. Thereafter, the exposed printing plate was immersed in a developer of isopropanol/water = 2:1 (volume ratio) for 1 min. at 20° C. The surface of the printing plate was softly rubbed with cotton to develop the same. The matted layer was removed over the whole surface of the plate. In addition, the unexposed areas of the light sensitive layer and the polyvinyl formal layer thereon were cleanly removed. However, the exposed areas of the light sensitive layer and the polyvinyl formal layer thereon remained without undergoing any damage. The printing plate gave good prints (50,000 sheets or more) and the efficiency of using the same was completely the same as that of the printing plate obtained using a light sensitive printing plate where no matted layer was provided.

EXAMPLE 7

To 53 g (0.5 mol) of diethylene glycol was added 197 g (1.05 mol) of xylylene diisocyanate. The mixture was reacted at 80° C. for 2 hrs. To 390 g (1.0 mol) of hydroxyethyltetrahydrophthalyl-acrylate represented by the formula:

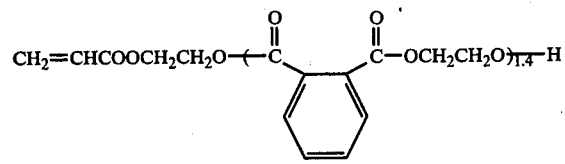

(OH value, 146; average molecular weight, 390) there was added 0.30 g of 2,6-di-t-butyl cresol as a polymerization initiator. The mixture was reacted at 80° C. for 8 hours. while blowing air therethrough to give a divinyl urethane compound having a residual isocyanate value of 4.8.

To 60 parts of the divinyl urethane compound were added 40 parts of CAP, cellulose acetate hydrogen phthalate, (tradename, made by Wako Junyaku Co., Ltd., phthalic acid content, 32% by weight), 1 part of benzoin ethyl ether as a sensitizer, 0.05 part of 4,4-thiobis(3-methyl-6-t-butylphenol) as a thermal polymerization inhibitor and 0.025 part of methylene blue as an image coloring agent, and to the mixture were added 40 parts of acetone and 30 parts of methanol as solvents to dissolve the system. Thereafter, the solution was allowed to stand overnight to defoam the same. The defoamed solution was then coated on an aluminum plate 0.3 mm thick which had been previously subjected to a graining treatment in a layer thickness of 0.6 mm as a light sensitive layer (dry basis). The coated layer was then dried. On the thus provided light sensitive layer was coated a solution having the composition given below in an amount of 0.08 g/m² (dry basis) in a manner as is shown in FIG. 2. The height thereof was about 3μ, the size was about 160μ, the distance was about 1000μ and the $H_{CLA}$ was 0.6μ. The coated layer was dried.

| Water | 100 | g |
|---|---|---|
| Polyvinyl pyrrolidone (molecular weight: 50,000 to 100,000) | 15 | g |
| Whitex PA (tradename, made by Sumitomo Chemical Co., Ltd.) (λ= 344 mμ) | 0.02 | g |

The light sensitive relief printing plate could be intimately contacted with an original in 30 to 40 seconds while a printing plate without the matted layer required intimate contact for more than 1 min. The printing plate having the matted layer was exposed to light at a distance of 6 cm for 50 mins. using a printer having at 20 watt chemical lamp (FL-20 BL, made by Tokyo Shibaura Electric Industry Co., Ltd.). The thus exposed printing plate was then immersed in a developer at 25° C. for 3 minutes having the composition indicated below to develop the same.

| Isopropanol | 0.5 | g |
|---|---|---|
| Sodium Hydroxide | 0.2 | g |
| Water | 100 | g |

The matted layer was removed over the whole surface of the plate. In addition, the unexposed areas of the light sensitive layer were dissolved out. There was no substantial influence by the matted layer containing Whitex PA and good relief printing plate was obtained.

The thus obtained printing plate gave more than 200,000 good prints.

While the invention has been described in detail and with reference to specific embodiments thereof, it will be apparent to one skilled in the art that various changes and modifications can be made therein without departing from the spirit and scope thereof.

What is claimed is:

1. A light-sensitive printing plate precursor for forming dot images comprising a support having provided thereon a light-sensitive layer and as a separate layer over said light-sensitive layer a non-light sensitive matted layer, the matted layer being removed upon development and containing a light absorbing agent possessing an absorption in the wave length region to which the light sensitive layer coated on said support is sensitive, said matted layer comprising a surface micropattern having the following surface roughness: the height of an individual micropattern element is in the range of about 2 to about 40μ; the width of an individual micropattern element is in the range of about 20 to 10,000μ; the distance between individual coated micropattern elements adjacent to each other is in the range of about 50 to about 100,000μ; and the surface roughness of the micropattern is in the range of from about 0.05 to about 20μ as $H_{CLA}$ (JIS).

2. The plate precursor of claim 1 wherein said light absorbing agent is selected from the group consisting of a dye, a pigment, a diazo compound, an ethylenically unsaturated compound and an ultraviolet ray absorbing agent.

3. The plate precursor of claim 2 wherein said dye is a food dye.

4. The plate precursor of claim 1 wherein said light absorbing agent possesses an absorption at a wavelength of about 200 mμ to about 800 mμ.

5. The plate precursor of claim 4 wherein said absorption is at 250 mμ to 600 mμ.

6. The plate precursor of claim 4 wherein said matted layer contains a matting agent.

7. The plate precursor of claim 6 wherein said matting agent has a particle diameter of about 2 to about 40 microns and the amount thereof is about 0.05 to about 4 parts by weight to 1 part by weight of a binder which is further present in said matted layer.

8. The plate precursor of claim 4 wherein said matted layer is coated in an amount of from about 0.01 to about 5.0 g/m², dry basis.

9. The plate precursor of claim 1 wherein said micropattern is a discontinuous layer comprising discrete areas on said layer of light-sensitive material.

10. The plate precursor of claim 1 wherein said micropattern comprises a continuous a layer on said light-sensitive layer, said layer having discrete raised portions thereon.

11. A process for producing a printing plate which comprises (1) intimately contacting an original transparency with the outermost layer of a light-sensitive printing plate comprising a support having coated thereon, in order, a light-sensitive layer and an outermost layer comprising a non-light sensitive matted layer, the matted layer being removed upon development and containing a light absorbing agent possessing an absorption in the wave length region to which the light sensitive layer coated on said support is sensitive, said matted layer comprising a surface micropattern having the following surface roughness: the height of an individual micropattern element is in the range of about 2 to about 40μ; the width of an individual micropattern element is in the range of about 20 to 10,000μ; the distance between individual coated micropattern elements adjacent to each other is in the range of about 50 to about 100,000μ; and the surface roughness of the micropattern is in the range of from about 0.05 to about 20μ as $H_{CLA}$ (JIS), by a vacuum adhesion method, (2) exposing said plate to actinic light through said original transparency, and then (3) removing with a developing solution either the exposed areas or the unexposed areas of said light-sensitive layer and substantially the entire outermost layer, thereby to prepare said printing plate.

12. The process of claim 11 wherein said light absorbing agent is selected from the group consisting of a dye, a pigment, a diazo compound, an ethylenically unsaturated compound and an ultraviolet ray absorbing agent.

13. The process of claim 12 wherein said dye is a food dye.

14. The process of claim 11 wherein said light absorbing agent possesses an absorption at a wavelength of about 200 mμ to about 800 mμ.

15. The process of claim 14 wherein said absorption is at 250 mμ to 600 mμ.

16. The process of claim 14 wherein said matted layer contains a matting agent.

17. The process of claim 16 wherein said matting agent has a particle diameter of about 2 to about 40 microns and the amount thereof is about 0.05 to about 4 parts by weight to 1 part by weight of a binder which is further present in said matted layer.

18. The process of claim 14 wherein said matted layer is coated in an amount of from about 0.01 to about 5.0 g/m², dry basis.

19. The process of claim 11 wherein said micro pattern is a discontinuous layer comprising discrete areas on said layer of light-sensitive material.

20. The process of claim 11 wherein said micropattern comprises a continuous layer on said light-sensitive layer, said layer having discrete raised portions thereon.

* * * * *